United States Patent
Ritter (10) Patent No.: US 7,323,854 B2
(45) Date of Patent: Jan. 29, 2008

(54) ZERO CANCELLATION IN MULTILOOP REGULATOR CONTROL SCHEME

(75) Inventor: David W. Ritter, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 259 days.

(21) Appl. No.: 11/197,919

(22) Filed: Aug. 5, 2005

(65) Prior Publication Data

US 2007/0030074 A1 Feb. 8, 2007

(51) Int. Cl.
*G05F 1/00* (2006.01)

(52) U.S. Cl. ............ 323/280; 323/281; 323/315; 323/316; 323/276; 323/277; 323/274; 361/93.9; 361/126; 330/297; 330/257; 330/292; 330/107

(58) Field of Classification Search .......... 323/280, 323/281, 315, 316, 274, 276, 277, 908; 330/297, 330/257, 292, 107, 146; 361/93.9, 126
See application file for complete search history.

(56) References Cited

U.S. PATENT DOCUMENTS

| | | | | | |
|---|---|---|---|---|---|
| 3,983,502 | A | * | 9/1976 | Wheatley, Jr. | 330/255 |
| 4,949,054 | A | * | 8/1990 | Briefer | 331/117 R |
| 5,945,818 | A | * | 8/1999 | Edwards | 323/273 |
| 6,556,083 | B2 | * | 4/2003 | Kadanka | 330/292 |
| 6,861,827 | B1 | * | 3/2005 | Yang et al. | 323/273 |
| 2007/0096825 | A1 | * | 5/2007 | Okuyama | 330/292 |

FOREIGN PATENT DOCUMENTS

| | | |
|---|---|---|
| EP | 0564983 A1 | 10/1993 |
| JP | 10256838 | 9/1998 |

* cited by examiner

*Primary Examiner*—Bao Q. Vu
*Assistant Examiner*—Stuart Hansen
(74) *Attorney, Agent, or Firm*—Bever, Hoffman & Harms, LLP; Jeanette S. Harms (57) ABSTRACT

Control loops in a voltage regulator can be stabilized using minimal silicon area. A current limit signal, generated by a current limit control loop in the voltage regulator, can be divided to minimize a zero provided in a compensation set associated with a voltage control loop, thereby stabilizing both loops. The compensation set can include a resistor (the zero) and a capacitor (a pole) connected in series between output and input terminals of an amplifier. Dividing the current limit signal can include injecting a first portion of the current limit signal on a first side of the resistor and injecting a second portion of the current limit signal on a second side of the resistor. The ratio of the first and second portions can be based on a gain of the amplifier, thereby minimizing an effect of the resistor.

18 Claims, 6 Drawing Sheets

ZERO CANCELLATION IN MULTILOOP REGULATOR CONTROL SCHEME

BACKGROUND OF THE INVENTION

1. Field of the Invention

The present invention relates to a DC voltage regulator and in particular to an error amplifier in the DC voltage regulator. This error amplifier advantageously includes a single compensation solution for both the voltage control loop and the current limit control loop.

2. Related Art

Figure 1A:
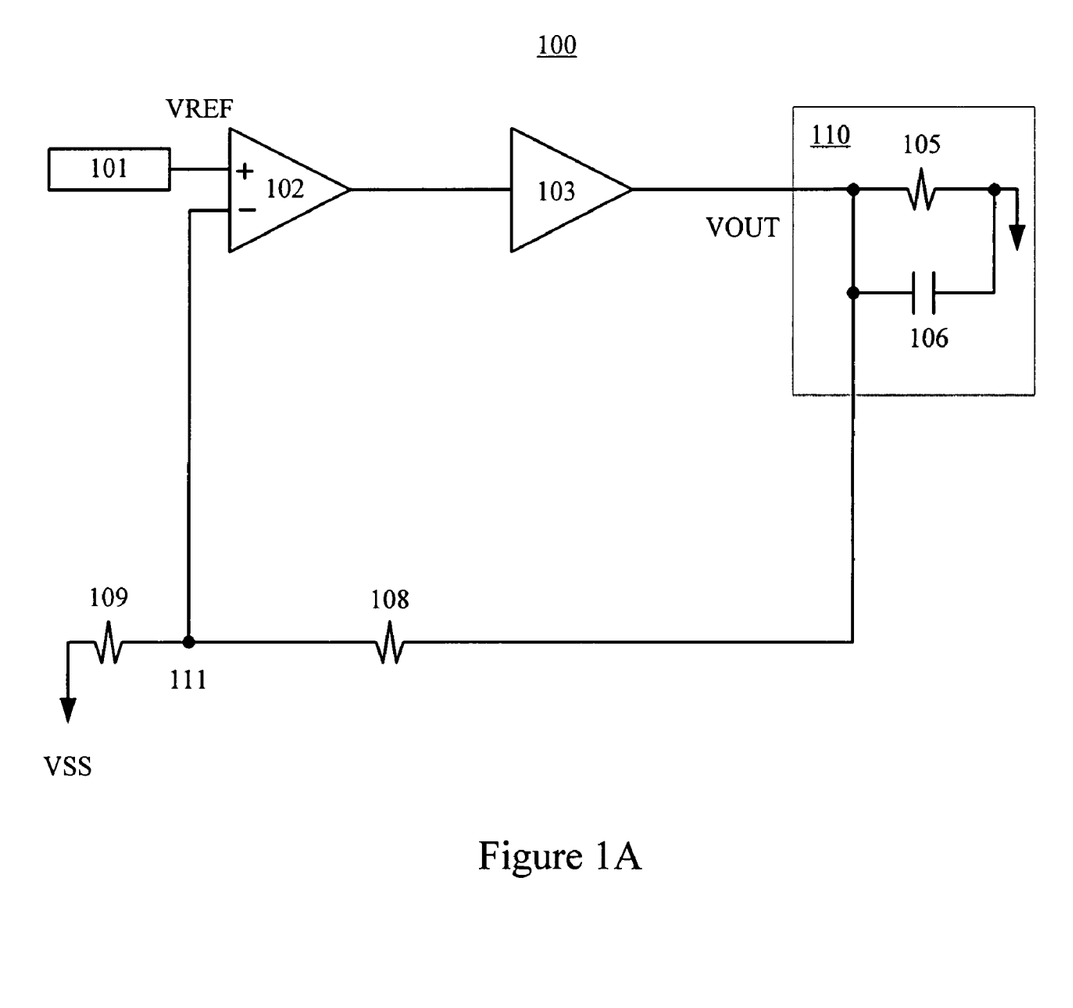
FIG. 1A illustrates a simple DC voltage regulator including a voltage control loop.

Typical DC voltage regulators employ a voltage control loop to stabilize output voltage over a variety of conditions. FIG. 1A illustrates a conventional DC voltage regulator (hereinafter regulator) 100. In regulator 100, an error amplifier 102 provides its output to an output driver 103. Output driver 103 typically comprises hundreds or even thousands of transistors. Voltage VOUT in turn drives a load 110, which has both a resistance component 105 and a capacitive component 106. In a typical embodiment, load 110 is located external to the integrated circuit implementing regulator 100.

In regulator 100, the voltage control loop includes resistors 108 and 109 connected in series between the node providing VOUT and a voltage source VSS. A node 111, which is located between resistors 108 and 109, provides a feedback voltage to the negative input terminal of error amplifier 102. A reference voltage Vref, which is typically generated by a bandgap circuit 101, is provided to the positive input terminal of error amplifier 102. In this configuration, error amplifier 102 can measure (i.e. sample) the output voltage VOUT using the resistive divider comprising resistors 108 and 109, thereby facilitating equalization of the input voltages to error amplifier 102. This voltage control loop is provided for normal operating conditions in regulator 100.

Figure 1B:
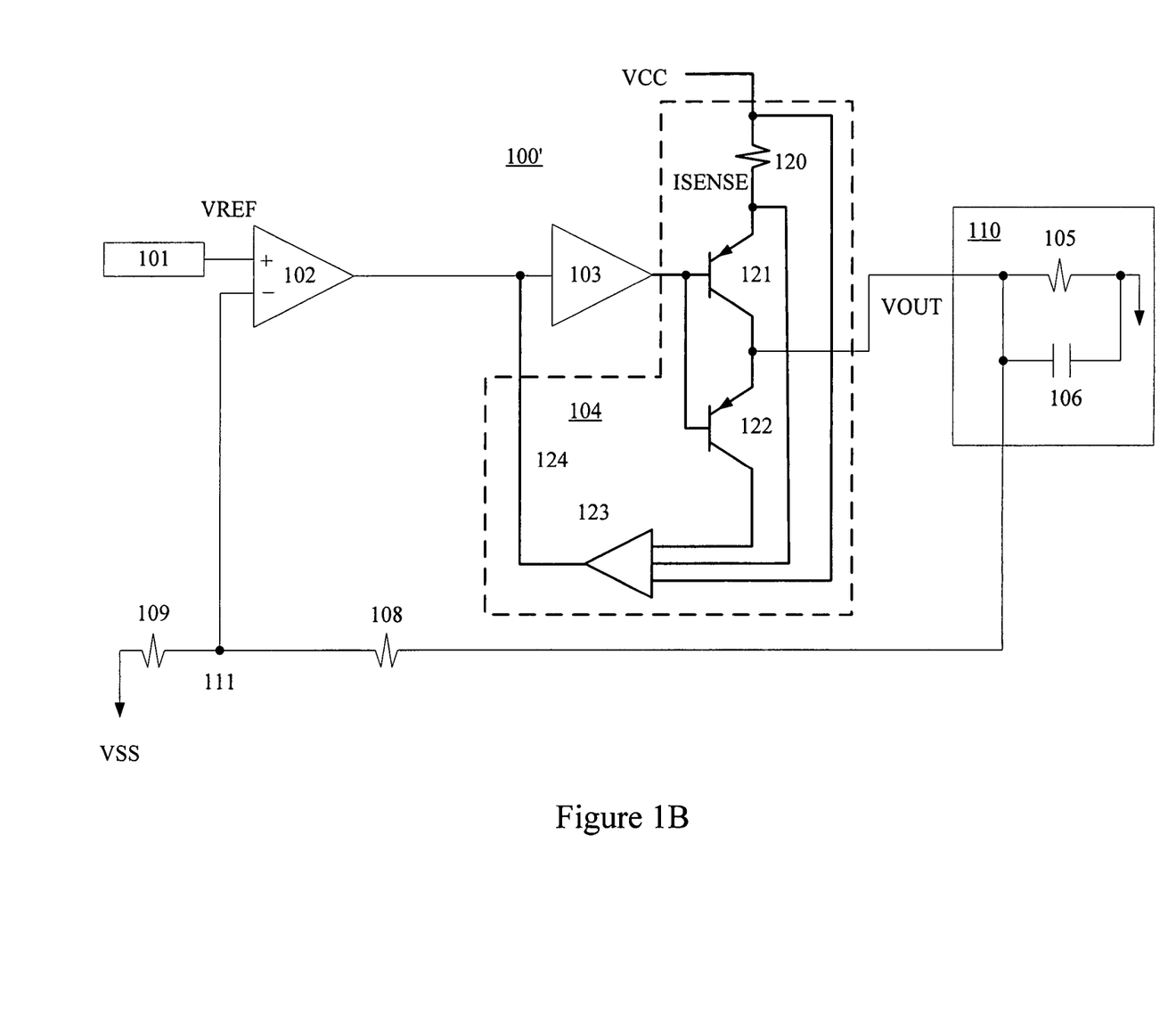
FIG. 1B illustrates a voltage regulator including both a voltage control loop and a current limit loop.

A standard regulator can also include another control loop for over-current conditions, which could be destructive to the regulator as well as the integrated circuit on which it is formed. For example, FIG. 1B illustrates an exemplary current limit circuit 104 that can be added to regulator 100 to form a modified regulator 100'. Current limit circuit 104 can include two PNP transistors 121 and 122 connected in series between a resistor 120 and an amplifier 123. Both PNP transistors 121 and 122 receive the output of power device 103 on their bases. Resistor 120 is connected between the emitter of PNP transistor 121 and a source voltage VCC. Amplifier 123 receives a first input from source voltage VCC, a second input from the emitter of PNP transistor 121, and a third input from the collector of PNP transistor 122.

Amplifier 123 provides its output via a feedback loop to the input of power device 103. A node between the collector of PNP transistor 121 and the emitter of PNP transistor 122 provides the output voltage VOUT when PNP transistor 121 is conducting. In this configuration, compensation circuit 104 can sense a current ISENSE at the output of power device 103. If a current limit condition exists, then amplifier 123 supplies a current that is proportional to the excessive current (i.e. the amount of current exceeding a nominal maximum current). This current should correspondingly limit the drive to power device 103, thereby preventing localized overheating on the integrated circuit.

Note that when the output voltage VOUT gets too high relative to an input voltage source VIN (e.g. VIN−VOUT<150 mV), PNP transistor 121 begins to saturate, thereby turning on PNP transistor 122. When PNP transistor 121 begins to saturate, excess carriers are injected into the substrate. These excess carriers in the substrate can undesirably cause significant instability in many components of regulator 100.

In one embodiment, current limit circuit 104 can detect and respond to both conditions. Specifically, in either case (or even potentially when both conditions exist), amplifier 123 can use its inputs to generate a current commensurate with the degree to which a current limit condition exists and/or when PNP transistor 121 begins to saturate. Note that amplifier 123 has two inputs: one voltage sensitive differential input for ISENSE (therefore, amplifier 123 can function as a gm amplifier) and one current sensitive single-ended input for PNP transistor 122 (therefore, amplifier 123 can also function as a current amplifier).

Unfortunately, either or both of the voltage control loop and the current limit control loop in regulator 100' can be a source of regulator destabilization. Specifically, each control loop should provide a negative feedback in regulator 100'. Unfortunately, components in these control loops could undesirably cause a positive feedback, thereby destabilizing regulator 100' by causing an oscillation in output voltage VOUT. This oscillation could prevent efficient voltage correction, elimination of a current limit condition, or could even cause significant damage to other integrated circuits driven by regulator 100'.

Therefore, a need arises for a system and method of providing stabilized control loops in a regulator.

SUMMARY OF THE INVENTION

In accordance with one aspect of the invention, control loops in a voltage regulator can be stabilized using minimal silicon area. Specifically, a current limit signal, generated by a current limit control loop in the voltage regulator, can be divided to minimize a zero provided in a compensation set associated with a voltage control loop, thereby stabilizing both loops. The compensation set can include a resistor (the zero) and a capacitor (a pole) connected in series between output and input terminals of an amplifier. Dividing the current limit signal can include injecting a first portion of the current limit signal on a first side of the resistor and injecting a second portion of the current limit signal on a second side of the resistor. The ratio of the first and second portions can be based on a gain of the amplifier, thereby minimizing an effect of the resistor. This amplifier can be the second stage of a multi-stage error amplifier.

For example, the error amplifier can include a first amplifier and a second amplifier. In one embodiment, the first amplifier can include a differential amplifier, and the second amplifier can include a current amplifier. The first amplifier can have a first input terminal for receiving a reference voltage and a second input terminal for receiving a signal from the voltage control loop. The second amplifier can receive an output of the first amplifier. The compensation set can include a resistor and a capacitor connected in series between an output of the second amplifier and an input of the second amplifier.

Notably, the error amplifier can further include a ratiometric branching compensation circuit that receives the current limit signal and injects current to both sides of the resistor in the compensation set. The ratio of the injected currents is substantially the same as a gain of the second amplifier. In one embodiment, the ratiometric branching compensation circuit can include first and second transistors. Each of the transistors has a terminal connected to a voltage source (e.g. ground) and a control terminal for receiving the current limit signal. However, each transistor has another terminal connected to a different side of the resistor. In one embodiment, the first and second transistors can be implemented with NMOS transistors having a voltage source of ground. This error amplifier can be included within an otherwise standard voltage regulator.

As discussed in further detail herein, the ratiometric branching compensation circuit can advantageously stabilize both the voltage control loop and the current limit control loop while minimizing silicon area. Specifically, by minimizing (or even eliminating) the effect of the resistor in the compensation set, the loops can share a single compensation capacitor.

BRIEF DESCRIPTION OF THE FIGURES

Elements in the figures having identical reference numbers can be characterized as similar elements.

DETAILED DESCRIPTION OF THE FIGURES

The goal of a voltage regulator is to provide a stable output voltage VOUT. Control loops within the voltage regulator can introduce an undesirable oscillation in output voltage VOUT. In accordance with one aspect of the invention, the use of "poles" and "zeros" can be advantageously used to stabilize the voltage regulator in a silicon-efficient manner.

Overview: Poles and Zeros

In general, for a stable loop, the feedback signal should be opposite in polarity to the source signal (e.g. in a voltage regulator, the reference voltage would be the source signal). For this reason, the feedback signal is typically characterized as a negative feedback. This negative feedback opposes any change introduced by the source signal, thereby ensuring a stable output. In contrast, positive feedback has the same polarity as the source signal, thereby amplifying any fluctuation in the source signal and resulting in an unstable control loop.

A feedback signal can experience fluctuations in gain and phase as it travels on a control loop. A phase shift refers to the total phase change that occurs within a control loop. An ideal negative feedback is 180° out of phase with the source signal, i.e. starting at −180°. Logically, if the negative feedback experiences a phase shift of 180°, then that negative feedback becomes positive feedback.

Figure 1C:
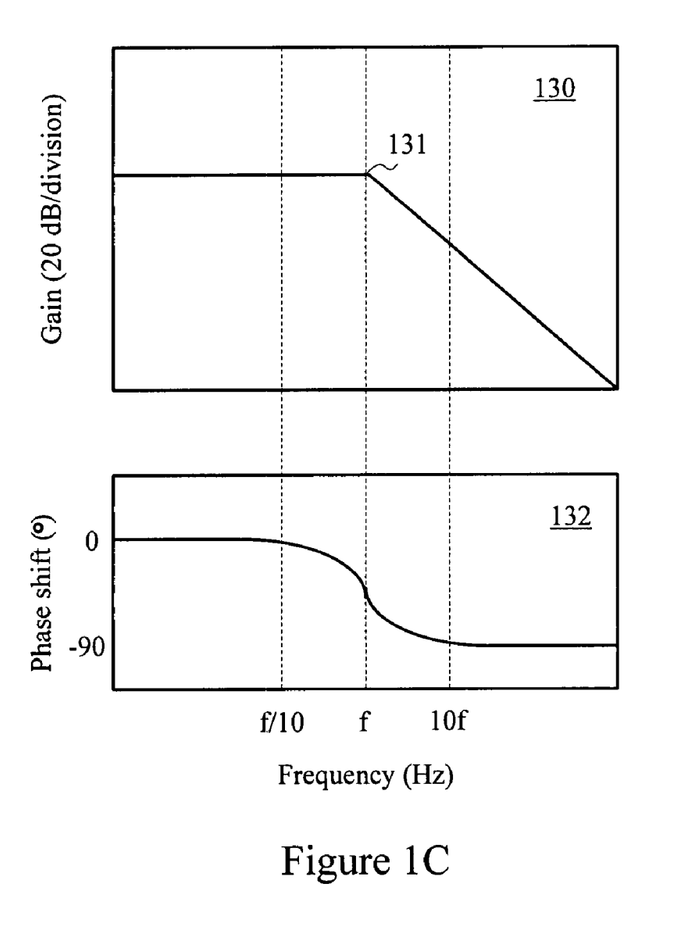
FIG. 1C illustrates a Bode plot of a pole and its corresponding phase shift.
Figure 1D:
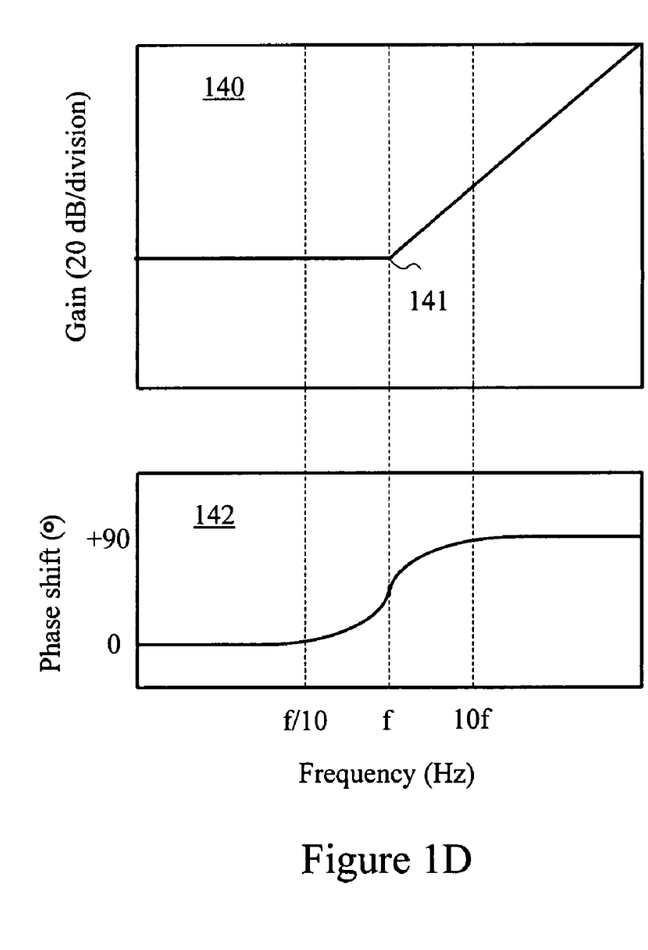
FIG. 1D illustrates a Bode plot of a zero and its corresponding phase shift.

The phase shift of any control loop can be computed by using a Bode plot, which shows the gain (dB) of a loop as a function of frequency (Hz). The amount of phase shift that has occurred at unity gain (0 dB) determines the stability of that control loop. A "pole" can be defined as a point on the gain curve where the slope changes by −20 dB. FIG. 1C illustrates a Bode plot 130 having a pole 131 and its corresponding computed phase shift plot 132. As shown in phase shift plot 132, a pole changes the phase shift almost −90° within one decade above and one decade below the pole frequency (the actual equation being phase shift=−arctan (f/fp), wherein the frequency f is caused by the pole frequency located at frequency fp). In contrast, a "zero" can be defined as a point on the gain curve where the slope changes by +20 dB. FIG. 1D illustrates a Bode plot 140 having a pole 141 and its corresponding computed phase shift plot 142. As shown in phase shift plot 142, a zero changes the phase shift almost +90° within one decade above and one decade below the pole frequency (the actual equation being phase shift=arctan (f/fp)).

Figure 1E:
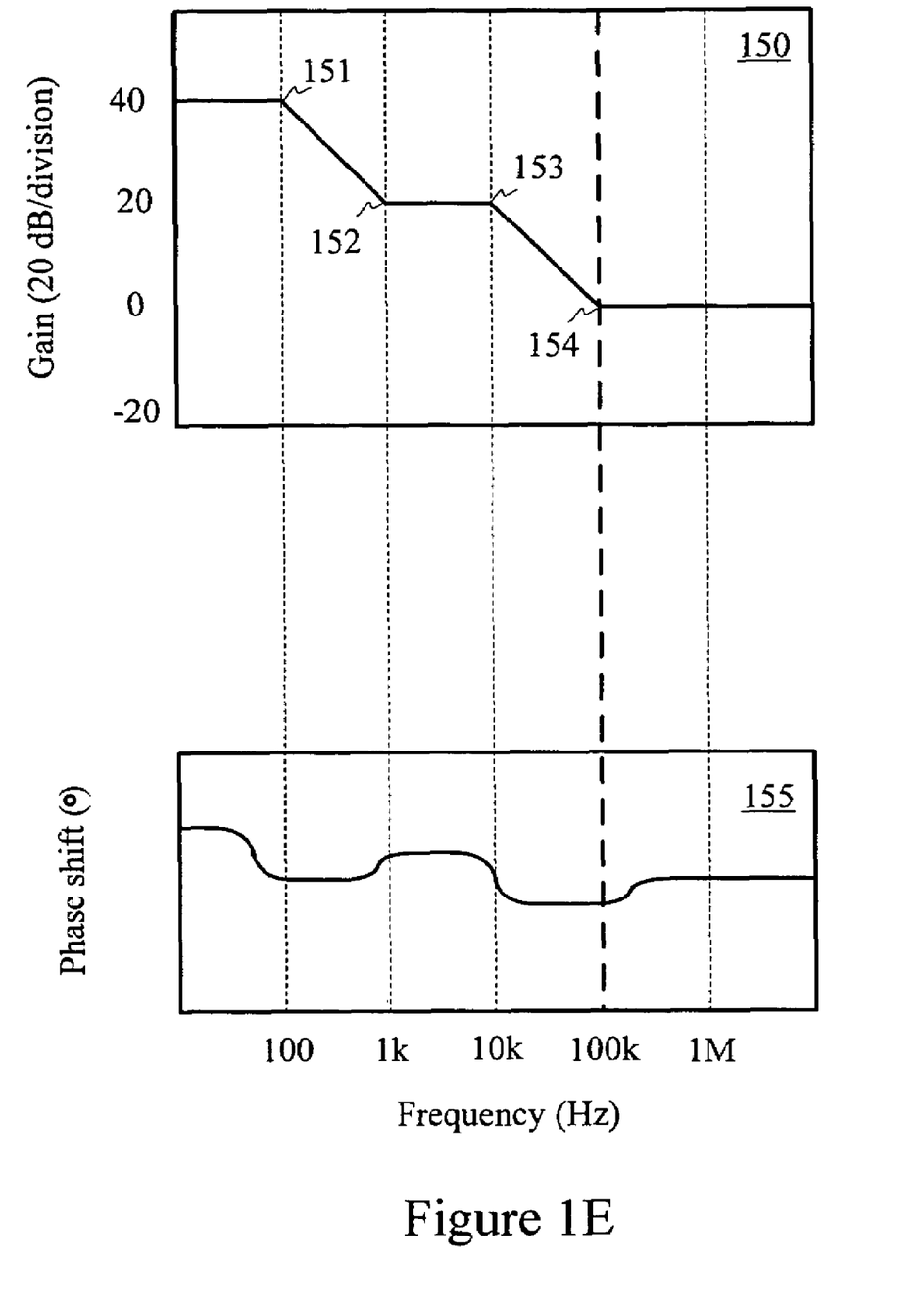
FIG. 1E illustrates a Bode plot having multiple poles and zeros and its corresponding phase shift.

In a typical control loop, both poles and zeros can be present, wherein each pole decreases the slope in the Bode plot by −20 dB/decade and each zero increases the slop by +20 dB/decade. FIG. 1E illustrates a Bode plot 150 having two poles and two zeros, i.e. poles 151 and 153, and zeros 152 and 154, and its corresponding phase shift plot 155. In this embodiment, the DC gain is 40 dB with pole 151 occurring at 1 kHz, zero 152 occurring at 10 kHz, pole 153 occurring at 100 kHz, and zero 154 occurring at 1MHz. Note that poles 151 and 153 generate a slope of −20 dB/decade whereas zeros 152 and 154 change the slope back to 0 dB/decade.

To determine if the control loop is stable, the phase shift at 0 dB (also called the unity-gain crossover frequency, which occurs at 1 MHz in this case) can be determined. In phase shift plot 155, poles 151 and 153 as well as zero 152 contribute phase shifts of −90°, +90°, and −90°, respectively. Because the unity-gain crossover frequency occurs at 100 kHz, zero 154 contributes most, but not all of a phase shift of +90°. Specifically, the final pole contributes approximately 60-80° (compared to the −90° from the previous three poles). Thus, the final phase shift is −10 to −30°. With this phase shift, the loop would be stable.

Control Loop Stability

Notably, each component of the voltage control loop and the current limit loop can contribute to a pole or zero. Additionally, parasitic poles can be present in the circuit. (Note that parasitic zeros may also be present. A parasitic zero can act as a right half plane zero (RHPZ), which has the same amplitude effect as a zero, but causes a phase shift that looks like a pole. Although a gain stage typically has a couple of poles and an RHPZ, the degradation effect to the gain and phase margins in the control loop from the parasitic zero is usually minimal because of its high frequencies.) Transfer function analysis is therefore critical to ensure that both control loops are stable, i.e. provide negative feedback. The introduction and position of additional components to provide such stability are now described.

Figure 2:
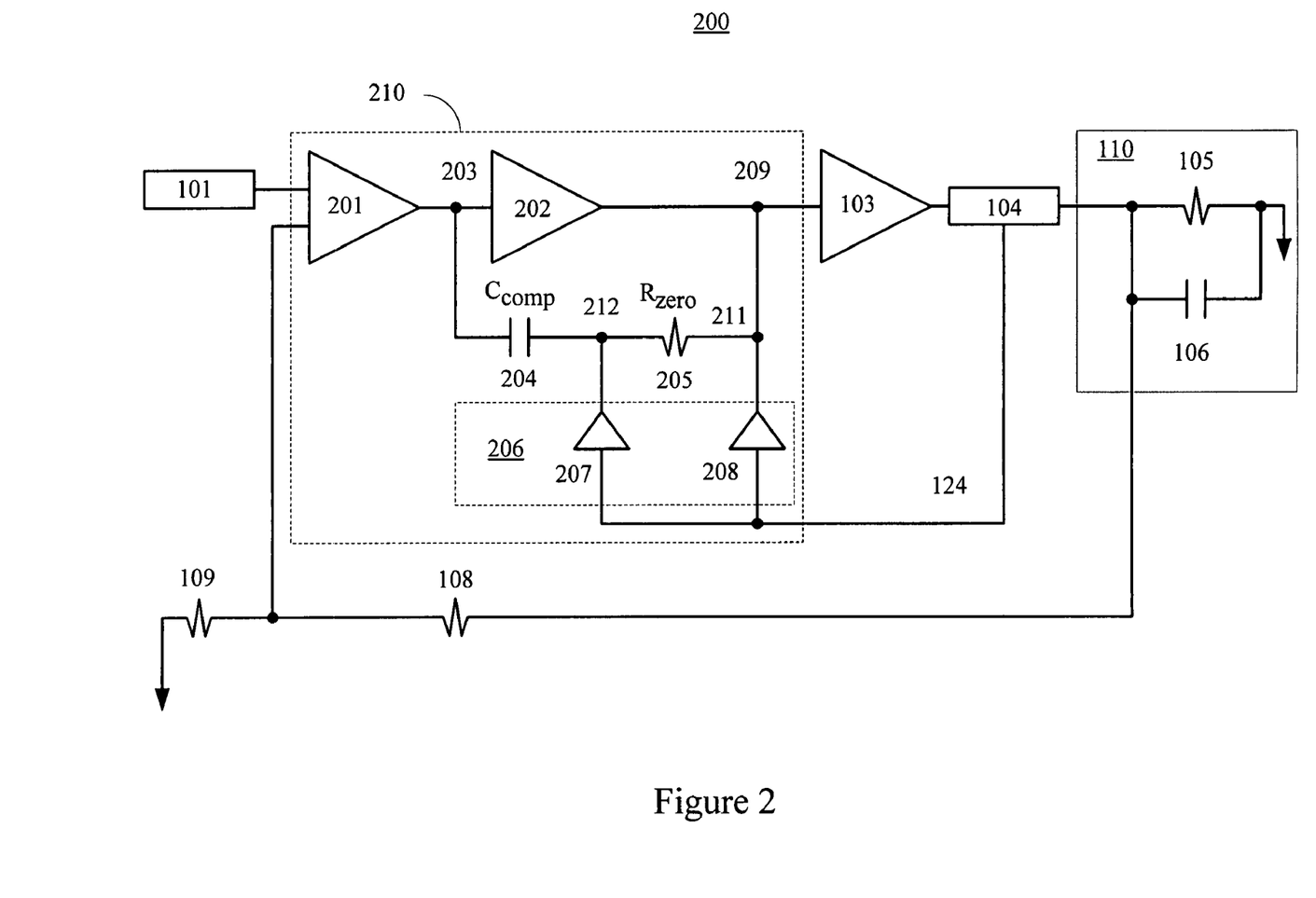
FIG. 2 illustrates an exemplary voltage regulator including a ratiometric branching compensation circuit. This ratiometric branching compensation circuit can provide a single compensation solution for both the voltage control loop and the current limit loop.

FIG. 2 illustrates a simplified voltage regulator 200 that can provide a stable control loops with minimal silicon area. In this embodiment, error amplifier 210 can include a differential amplifier 201 that receives the reference voltage 101 and a signal from the voltage control loop. The output of differential amplifier 201 is provided to a current amplifier 202, which in turn provides its output to driving device 103.

To control the gain and phase characteristics of the control loop, an extremely large compensation capacitor (not shown) could be used. Although this large compensation capacitor would also be a pole, the phase shift contributed by this component, in addition to the other poles and parasitic poles in the regulator, could still result in cumulative negative feedback. However, using a large compensation capacitor would significantly degrade the speed of the regulator and take up considerable silicon area, both of which are commercially unacceptable.

Alternatively, smaller compensation capacitors could be used, e.g. one for each control loop. However, any compensation capacitor takes up valuable silicon area and is a relatively expensive component to integrate into a system. Therefore, it would be desirable for both the voltage control loop and the current limit control loop to share a compensation capacitor.

The primary impediment to sharing compensation elements in a regulator is the existence of a standard compensation loop for the voltage control loop. As shown in FIG. 2, this compensation loop includes a resistor 205 and a compensating capacitor 204 connected in series between nodes 209 and 203. Advantageously, capacitor 204 and resistor 205 can be adjusted to provide optimum performance during transient conditions while providing sufficient gain and phase shift to ensure stability of the voltage control loop.

Note that one goal of a high performance regulator is to robustly drive its output driver. Therefore, an error amplifier in the regulator is built with considerable gain. However, because of this high gain requirement and under some process conditions, the amplifier of the current limit circuit may not be able to provide the desired current limit correction for the error amplifier in the configuration shown in FIG. 1B, i.e. providing a correction to the output of the error amplifier.

Therefore, it would be desirable to provide the current limit correction to an internal stage of the error amplifier, which would have significantly lower gain (and much lower current) than its output, thereby enhancing the performance of current limit circuit 104. Note that simply providing the output of current limit circuit 104, i.e. the signal on line 124, to only node 211 within error amplifier 210 would create a transfer function with the same zero as the voltage control loop, i.e. result in an undesirable positive feedback.

Alternatively, simply providing the signal on line 124 to only node 212 would create even greater loop instability. Specifically, if a current pulse is applied to a circuit with a pole and a zero, an initial step (due to the zero, e.g. a resistor) is generated followed by a ramping waveform (due to the pole, e.g. a capacitor). This step and ramping waveform occur if the pulse is only applied to node 211. If, however, the pulse is applied to node 212, then the pulse is instantaneously transmitted through capacitor 204 to node 203 and amplifier 202, which is necessarily an inverting stage. In this case, the initial response is a step in the opposite direction before the ramp starts. This inversion of a short-term input relative to a long-term input is the hallmark of a RHPZ. Thus, applying a pulse to either node 212 or node 211 always generates a zero, i.e. a left half plane zero or right half plane zero. Notably, both types of zeros are bad for the current limit loop.

Therefore, in accordance with one aspect of the invention, a ratiometric branching compensation circuit 206 can be used to divide the signal from current limit circuit 104 and provide those divided signals to both nodes 211 and 212. To provide this division, ratiometric branching compensation circuit 206 can include two buffers 207 and 208. Notably, and discussed in further detail in reference to FIG. 3, buffers 207 and 208 can inject specific currents into nodes 212 and 211, respectively, based on the gain of current amplifier 202, thereby facilitating the cancellation of the effect of resistor 205 (i.e. $R_{zero}$). This cancellation advantageously yields stability for all loops using a single compensation capacitor 204 (i.e. a pole), thereby advantageously minimizing silicon area. Furthermore, this cancellation has the advantage of being able to adjust for loop stability in normal operation without concern for loop instability in a current limit condition.

Error Amplifier: Exemplary Embodiment

Figure 3:
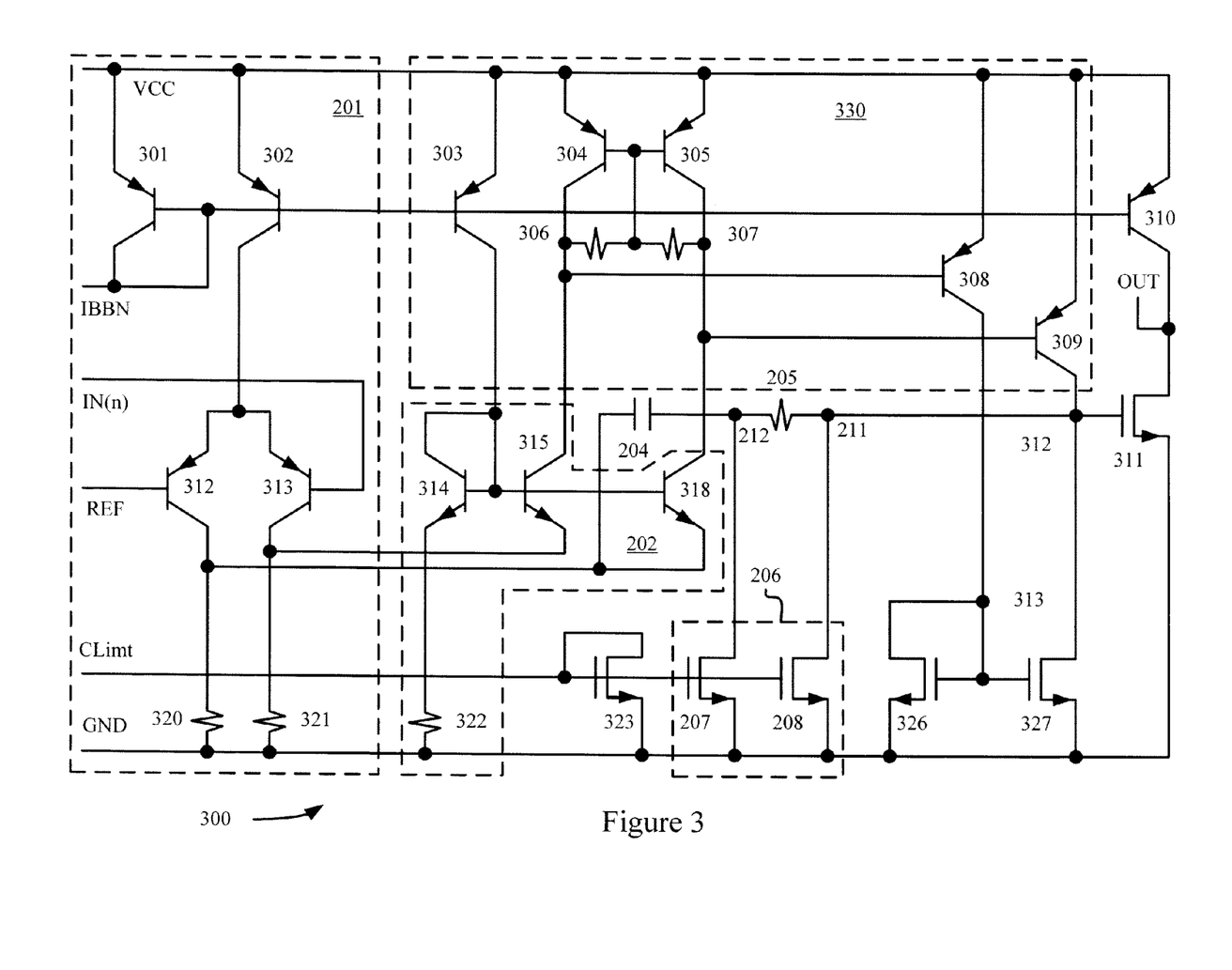
FIG. 3 illustrates an exemplary error amplifier including an implementation of the ratiometric branching compensation circuit.

FIG. 3 illustrates an exemplary implementation of an error amplifier 300 that includes a ratio metric branching compensation circuit. In this embodiment, differential amplifier 201 can include PNP transistors 301, 302, 312, and 313 as well as resistors 320, 321, and 322. PNP transistor 301 has its base and collector connected to a current source (IBBN) whereas its emitter is connected to voltage source VCC. PNP transistor 302 has its emitter connected to voltage source VCC, its base connected to the base of PNP transistor 301, and its collector connected to the emitters of PNP transistors 312 and 313. The bases of PNP transistors 312 and 313 receive, respectively, the reference voltage REF and the negative input signal (INn)(i.e. the signal on the voltage control loop). The collectors of PNP transistors 312 and 313 are connected to voltage source GND (ground) via resistors 320 and 321, respectively.

Note that differential amplifier 201 actually provides a full differential output to current amplifier 202, which can include NPN transistors 314, 315, and 318 as well as a resistor 322. Specifically, the collectors of PNP transistors 312 and 313 are connected to the emitters of NPN transistors 318 and 315, respectively, to provide the differential signal. NPN transistor 314 has its emitter connected to voltage source GND via resistor 322. The bases of NPN transistors 314, 315, and 318 are commonly connected to the collector of NPN transistor 314. In this configuration, diode-connected NPN transistor 314 can set the bias of NPN transistors 315 and 318. Note that the values of resistors 320, 321, and 322 can be set (e.g. to 10 kOhm) such that the added current from PNP transistors 312 and 313 causes the same drop across resistors 320 and 321 as resistor 322, thereby balancing differential amplifier 201 and current amplifier 202. In this manner, any variation in the input signal can be accurately mirrored in NPN transistors 315 and 318.

In this embodiment, ratiometric branching compensation circuit 206 can include NMOS transistors to implement buffers 207 and 208 (in reference to FIG. 3, described as NMOS transistors 207 and 208). NMOS transistors 207 and 208 have sources connected to voltage source GND, and gates commonly connected to receive the signal from the current limit circuit (CLimit). An NMOS transistor 323 has a source connected to voltage source GND, a gate connected to receive the signal from a current limit circuit (CLimit), and a drain connected to its gate. Note that NMOS transistor 323 can be characterized as forming part of an amplifier 330 (described below). In this diode-connected configuration, NMOS transistor 323 can set up how much bias is actually provided to NMOS transistors 207 and 208, thereby determining how much current they can generate. More specifically, the size of NMOS transistor 323 determines the gain of the current limit loop.

Amplifier 330 can receive differential current provided by current amplifier 202 and generate a voltage, thereby functioning as a transimpedance amplifier. In this embodiment, amplifier 330 includes PNP transistors 303, 304, 305, 308, and 309 as well as resistors 306 and 307. The emitters of PNP transistors 304 and 305 are connected to voltage source VCC and their bases are commonly connected to a node between resistors 306 and 307. The collector of PNP transistor 304 is connected to the other terminal of resistor 306, the collector of NPN transistor 315, and the base of PNP transistor 308. The collector of PNP transistor 305 is connected to the other terminal of resistor 307, the collector of NPN transistor 318, and the base of PNP transistor 309. The emitters of PNP transistors 308 and 309 are connected to voltage source VCC. The collector of PNP transistor 308 is connected to the gate and the drain of an NMOS transistor 326 as well as the gate of an NMOS transistor 327. The collector of PNP transistor 309 is connected to the drain of NMOS transistor 327. The sources of NMOS transistors 326 and 327 are connected to voltage source GND.

In this configuration, node 312 represents the output of amplifier 330. Note that the sizes of resistors 306 and 307 as well as the sizes of PNP transistors 308 and 309 determine the current gain of amplifier 330. Amplifier 330 can advantageously provide a controlled amount of current gain without needing additional DC bias.

Notably, determining the ratio of the sizes of NMOS transistors 207 and 208 is important in facilitating the elimination of the effect of resistor 205, i.e. $R_{zero}$. Resistor 205 is connected between the drains of NMOS transistors 207 and 208. In contrast, capacitor 204 ($C_{comp}$) is connected between the emitter of NPN transistor 318 and the drain of NMOS transistor 207.

Assume for short duration pulses, capacitor 204 is shorted. Further assume that the effective resistance at the emitter of NPN transistor 318 is much lower than the resistance of resistor 205. In this case, applying a current pulse to nodes 212 and 211 will cause a current pulse 3× the size in node 312. If, simultaneously with the pulse at nodes 212 and 211, a 3× pulse is also applied at node 312, then the net current in resistor 205 is zero. In other words, the effect of the amplified pulse is essentially cancelled. Therefore, the size of resistor 205 is unimportant.

Based on the gain of current amplifier 202, the size ratio of NMOS transistors 207 and 208 can be advantageously selected to inject the appropriate amount of current into opposite sides of resistor 205, thereby effectively canceling the effect of $R_{zero}$. For example, assuming that the gain of current amplifier 202 is 3, then NMOS transistor 207 could have M=1 and NMOS transistor 208 could have M=3. In this manner, the injected current provided at node 212 would be amplified by current amplifier 202 by 3 whereas the injected current provided at node 211 would be, without amplification, 3 times that of the injected current at node 212. Therefore, none of the injected current appears on resistor 205, thereby canceling the effect of $R_{zero}$. Once $R_{zero}$ is canceled, only the effect of capacitor 204, i.e. $C_{comp}$, is "seen" by the current limit loop (CLimit) (i.e. after sufficient time for capacitor 204 to start charging).

In one embodiment, resistor 205 could be 100-300 kOhm or even smaller, e.g. on the order of 10-40 kOhm. In accordance with one aspect of the invention, as long as the selected ratio in ratiometric branching compensation circuit 206 is "close" (e.g. within 25%) to the gain provided by current amplifier 202, the effect of $R_{zero}$ can still be minimized enough to ensure negative feedback.

A PNP transistor 310, which has an emitter connected to voltage source VCC and a collector connected to the drain of an NMOS transistor 311, receives the current signal IBBN on its base. NMOS transistor 311, which has a source connected to voltage source GND, is connected to the collector of PNP transistor 309 and the drain of MACS transistor 208. The collector of PNP transistor 310 and the drain of NMOS transistor 311 provide the output voltage OUT of the error amplifier.

To ensure a balanced output signal at node 312, additional components can be included to provide symmetry to those discussed. For example, PNP transistors 304/308 and resistor 306 can be included to provide symmetry to PNP transistors 305/309 and resistor 307, respectively. Furthermore, NMOS transistors 326 and 327 can also form a mirror to further balance the voltage at node 312. Note that transistors 326 and 327 are implemented in the same MOSFET technology as output device 311. Because any imbalance in the signal at node 312 is undesirable (i.e. thereby triggering the control loops to correct for an input offset), the components of error amplifier 300 can be advantageously configured to maximize symmetry.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, although regulator 300 includes specific MOSFET and bipolar transistors, other embodiments could include transistors of opposite type (i.e. PMOS for NMOS, or PNP for NPN) having their terminals similarly connected (however, with opposite voltage sources). Additionally, MOSFET transistors could be used for bipolar transistors and vice versa. For example, NPN transistors could be used instead of NMOS transistors 207 and 208 in FIG. 3. Therefore, regulator 300 can be implemented with the appropriate MOSFET and bipolar transistors depending on the conditions being detected.

Note that in other embodiments the differential amplifier and the current amplifier can be replaced with operational amplifiers. Therefore, in general, the error amplifier can be simply characterized as including first and second amplifiers, wherein the ratiometric branching compensation circuit is coupled to two nodes within the second amplifier. Further note that in other embodiments the ratiometric branching compensation circuit can be characterized as injected voltage, instead of current, into the two nodes.

Accordingly, it is intended that the scope of the invention be defined by the following Claims and their equivalents.

The invention claimed is:

1. An error amplifier comprising:
   a first amplifier having a first input terminal for receiving a reference voltage and a second input terminal for receiving a signal from a voltage control loop;
   a second amplifier receiving an output of the first amplifier;
   a compensation set associated with the voltage control loop, the compensation set including a resistor providing a fixed resistance and a capacitor connected in series between an output of the second amplifier and an input of the second amplifier; and
   a ratiometric branching compensation circuit for receiving a signal from a current limit circuit and injecting current to both sides of the resistor in the compensation set.

2. The error amplifier of claim 1, wherein the first amplifier includes a differential amplifier, and wherein the second amplifier includes a current amplifier.

3. The error amplifier of claim 1, wherein a ratio of the injected current is substantially the same as a gain of the second amplifier.

4. The error amplifier of claim 1, wherein the ratiometric branching compensation circuit comprises:

a first transistor including a first terminal connected to a first side of the resistor, a second terminal connected to a voltage source, and a control terminal for receiving the signal from the current limit circuit; and a second transistor including a first terminal connected to a second side of the resistor, a second terminal connected to the voltage source, and a control terminal for receiving the signal from the current limit circuit.

5. The error amplifier of claim 4, wherein the first and second transistors include NMOS transistors and the voltage source is ground.

6. A method of stabilizing control loops in a voltage regulator, the method comprising:

receiving a current limit signal from a current limit control loop in the voltage regulator; and dividing the current limit signal to minimize effects of a zero provided in a compensation set associated with a voltage control loop, thereby stabilizing both the voltage control loop and the current limit control loop.

7. The method of claim 6, wherein the compensation set includes a resistor generating the zero, and wherein dividing the current limit signal includes:

injecting a first portion of the current limit signal on a first side of the resistor; and injecting a second portion of the current limit signal on a second side of the resistor, thereby minimizing an effect of the resistor.

8. The method of claim 6, wherein dividing the current limit signal includes:

applying the divided current limit signal to minimize the effects of the zero.

9. A voltage regulator comprising:

an error amplifier including a ratiometric branching compensation circuit;

a driving device connected to receive an output of the error amplifier;

a current limit circuit connected to receive an output of the driving device and generating a current limit signal for a current limit control loop;

a voltage control loop connected to receive the output of the current limit circuit and providing an input signal to the error amplifier; and a compensation set associated with the voltage control loop, the compensation set including a zero and a pole, wherein the ratiometric branching compensation circuit divides the current limit signal to minimize the zero in the compensation set, thereby stabilizing both the voltage control loop and the current limit control loop.

10. The voltage regulator of claim 9, wherein the ratiometric branching compensation circuit includes two buffers that receive the current limit signal and provide outputs to different sides of a resistor generating the zero.

11. An error amplifier comprising:

a differential amplifier having a first input terminal for receiving a reference voltage and a second input terminal for receiving a signal from a voltage control loop;

a current amplifier receiving an output of the differential amplifier;

a compensation set associated with the voltage control loop, the compensation set including a resistor providing a fixed resistance and a capacitor connected in series between an output of the current amplifier and an input of the current amplifier; and a ratiometric branching compensation circuit for receiving a signal from a current limit circuit and injecting current to both sides of the resistor in the compensation set.

12. The error amplifier of claim 11, wherein ratiometric branching compensation circuit includes:

a first NMOS transistor having a source connected to a first voltage source and a drain connected to a first junction of the resistor, the first junction located between the resistor and the capacitor; and a second NMOS transistor having a source connected to the first voltage source and a drain connected to a second junction of the resistor, wherein gates of the first and second NMOS transistor receive a current limit circuit output.

13. The error amplifier of claim 12, further including a third NMOS transistor having a source connected to the first voltage source, and a drain and a gate for receiving the current limit circuit output.

14. The error amplifier of claim 11, wherein the differential amplifier includes:

a first PNP transistor having a base and a collector connected to a current source and an emitter connected to second voltage source;

a second PNP transistor having an emitter connected to the second voltage source and a base connected to the base of the first PNP transistor;

a third PNP transistor having an emitter connected to a collector of the second PNP transistor and a base for receiving a reference voltage;

a fourth PNP transistor having an emitter connected to the collector of the second PNP transistor and a base for receiving a voltage control loop signal;

a second resistor connected between a collector of the third PNP transistor and the first voltage source; and a third resistor connected between a collector of the fourth PNP transistor and the first voltage source.

15. The error amplifier of claim 14, wherein the current amplifier includes:

a first NPN transistor having a base, a collector, and an emitter;

a second NPN transistor having an emitter connected to the collector of the fourth PNP transistor, a base, and a collector;

a third NPN transistor having an emitter connected to the collector of the third PNP transistor and a base connected to the bases of the first and second NPN transistors as well as the collector of the first NPN transistor, wherein the first junction of the first resistor is also a first junction of the capacitor, wherein a second junction of the capacitor is connected to the emitter of the third NPN transistor, and wherein the collectors of the first and third NPN transistors are connectable to an amplifying circuit; and a fourth resistor connected between the first voltage source and the emitter of the first NPN transistor.

16. The error amplifier of claim 15, wherein the amplifying circuit includes:

a fifth PNP transistor having an emitter connected to the second voltage source, a base connected to the base of the second PNP transistor, and a collector connected to the collector of the first NPN transistor;

a sixth PNP transistor having an emitter connected to the second voltage source and a collector connected to the collector of the second NPN transistor;

a seventh PNP transistor having an emitter connected to the second voltage source, a collector connected to the collector of the third NPN transistor, and a base connected to a base of the sixth PNP transistor;

an eighth PNP transistor having an emitter connected to the second voltage source, a base connected to the collector of the sixth NPN transistor, and a collector coupled to the first voltage source;

a ninth PNP transistor having an emitter connected to the second voltage source, a base connected to the collector of the seventh NPN transistor, and a collector coupled to the first voltage source;

a fifth resistor having a first junction connected to the bases of the sixth and seventh PNP transistors, and a second junction connected to the collector of the sixth PNP transistor; and a sixth resistor having a first junction connected to the bases of the sixth and seventh PNP transistors, and a second junction connected to the collector of the seventh PNP transistor.

17. The error amplifier of claim 16, further including:
a fifth NMOS transistor having a source connected to the first voltage source, and a gate and a drain connected to the collector of the eighth PNP transistor; and
a sixth NMOS transistor having a source connected to the first voltage source, a gate connected to the gate of the fifth NMOS transistor, and a drain connected to the collector of the ninth PNP transistor.

18. The error amplifier of claim 17, further including:
a fourth NMOS transistor having a source connected to the first voltage source, a gate connected to the collector the ninth PNP transistor and the second junction of the first resistor, and a drain connected to the output terminal of the error amplifier; and
a tenth PNP transistor having an emitter connected to the second voltage source, a base connected to the base of the fifth PNP transistor, and a collector connected to the output terminal of the error amplifier.

* * * * *

UNITED STATES PATENT AND TRADEMARK OFFICE
CERTIFICATE OF CORRECTION

PATENT NO.       : 7,323,854 B2                                    Page 1 of 1
APPLICATION NO.  : 11/197919
DATED            : January 29, 2008
INVENTOR(S)      : David Wayne Ritter

It is certified that error appears in the above-identified patent and that said Letters Patent is hereby corrected as shown below:

Column 7, line 64, replace "MACS" with -- NMOS --.

Column 12, line 12, insert -- of -- before "the" (first occurrence).

Signed and Sealed this

Sixth Day of May, 2008

JON W. DUDAS
*Director of the United States Patent and Trademark Office*